United States Patent
Ossman et al.

(10) Patent No.: US 10,867,096 B1
(45) Date of Patent: Dec. 15, 2020

(54) FPGA IMPLEMENTING PARTIAL DATAPATH PROCESSING, AND METHOD OF OPERATING SAME

(71) Applicant: Flex Logix Technologies, Inc., Mountain View, CA (US)

(72) Inventors: Valentin Ossman, Livermore, CA (US); Anthony Kozaczuk, Burlingame, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 16/659,233

(22) Filed: Oct. 21, 2019

Related U.S. Application Data

(60) Provisional application No. 62/748,750, filed on Oct. 22, 2018.

(51) Int. Cl.
*G06F 30/00* (2020.01)
*G06F 30/34* (2020.01)
*G06F 9/54* (2006.01)
*G06F 12/06* (2006.01)
*G06F 30/327* (2020.01)

(52) U.S. Cl.
CPC .............. *G06F 30/34* (2020.01); *G06F 9/544* (2013.01); *G06F 12/0607* (2013.01); *G06F 30/327* (2020.01)

(58) Field of Classification Search
CPC .... G06F 30/34; G06F 30/327; G06F 12/0607; G06F 9/544
See application file for complete search history.

(56) References Cited

U.S. PATENT DOCUMENTS

| | | | | |
|---|---|---|---|---|
| 5,822,550 A * | 10/1998 | Milhaupt | ............ | G06F 13/4068 710/315 |
| 7,051,309 B1 * | 5/2006 | Crosetto | ............... | G06F 9/3867 712/E9.062 |
| 7,301,990 B2 * | 11/2007 | Jayaraman | ............. | H04B 7/022 375/148 |
| 7,304,996 B1 * | 12/2007 | Swenson | ............. | H04L 45/7453 370/229 |
| 7,482,954 B1 * | 1/2009 | Trimberger | ......... | H03M 7/3084 341/50 |
| 7,568,137 B1 * | 7/2009 | Kellermann | .......... | H04L 1/0045 714/725 |
| 7,577,758 B2 * | 8/2009 | Ricciulli | ............. | H04L 47/2441 370/245 |

(Continued)

*Primary Examiner* — Naum Levin
(74) *Attorney, Agent, or Firm* — Neil A. Steinberg

(57) ABSTRACT

An integrated circuit including an FPGA having an input to receive an input data stream which includes a first portion and a second portion, processing circuitry to generate processed data by processing only the first portion of the input data stream via a data processing operation, and an output to output the processed data. The integrated circuit further includes logic circuitry, separate from the FPGA, including an input to receive the input data stream, data alignment circuitry to temporally synchronize the second portion of the input data stream with the processing of the first portion of the input data stream via the processing circuitry, and data combining circuitry to generate an output data stream using the processed data from the FPGA and the second portion of the input data stream received from the data alignment circuitry.

20 Claims, 13 Drawing Sheets

(56) References Cited

U.S. PATENT DOCUMENTS

| | | | | |
|---|---|---|---|---|
| 7,656,905 B2* | 2/2010 | Sheth | ........................ | H04J 3/07 |
| | | | | 370/503 |
| 7,688,116 B1* | 3/2010 | Wise | ........................ | H04L 7/033 |
| | | | | 326/93 |
| 7,805,445 B2* | 9/2010 | Boyer | ................ | G06K 9/00986 |
| | | | | 707/736 |
| 7,945,140 B2* | 5/2011 | Aubry | ........................ | H04N 5/76 |
| | | | | 386/207 |
| 8,345,703 B2* | 1/2013 | Heinkel | ............ | G06F 15/7867 |
| | | | | 370/419 |
| 8,559,482 B1* | 10/2013 | Dong | ........................ | H03D 7/165 |
| | | | | 375/146 |
| 8,981,813 B2* | 3/2015 | Chan | ............ | H03K 19/017581 |
| | | | | 326/40 |
| 9,491,495 B2* | 11/2016 | Bohm | ................ | H04L 25/4904 |
| 9,858,215 B1* | 1/2018 | Solomon | ................ | G06F 12/00 |
| 10,542,312 B1* | 1/2020 | Bassett | ............ | H04N 21/4341 |

* cited by examiner

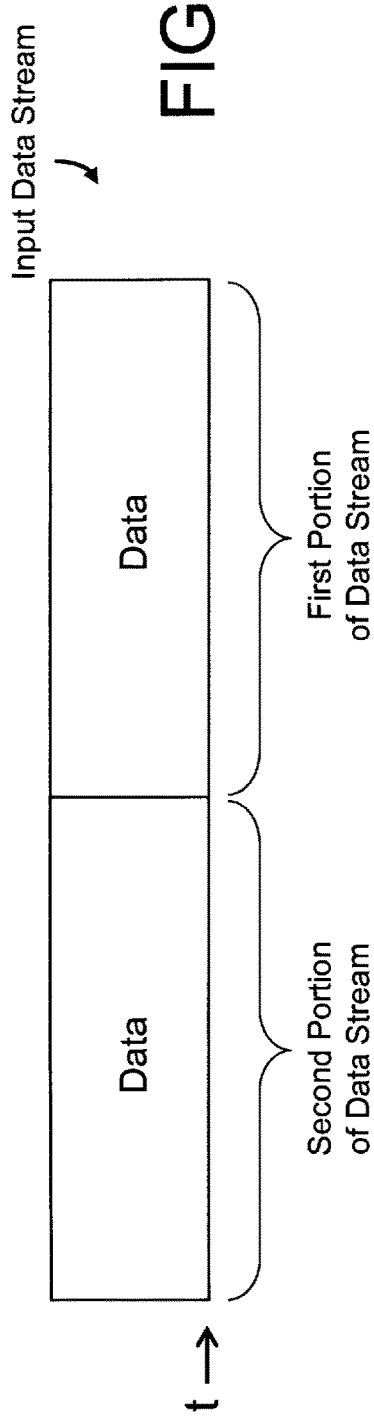
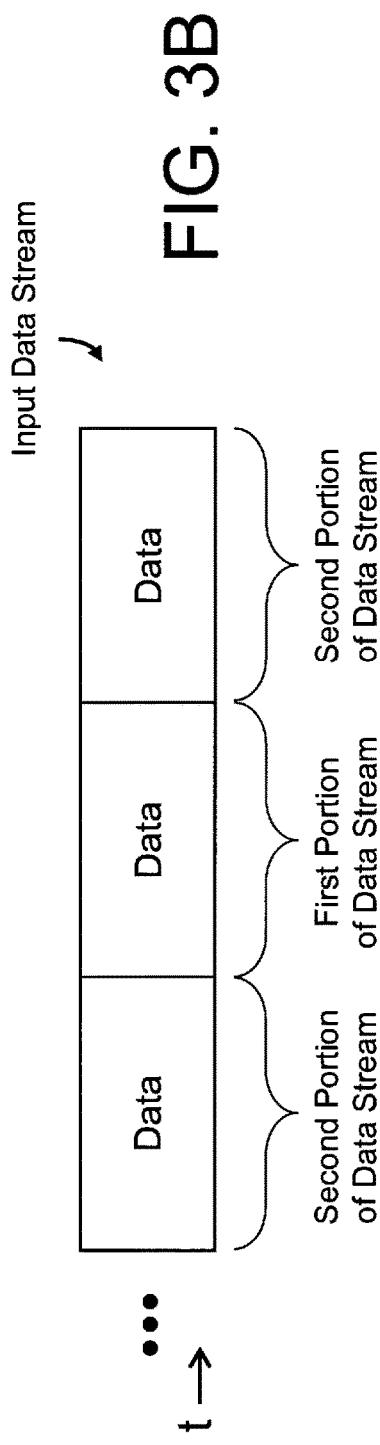
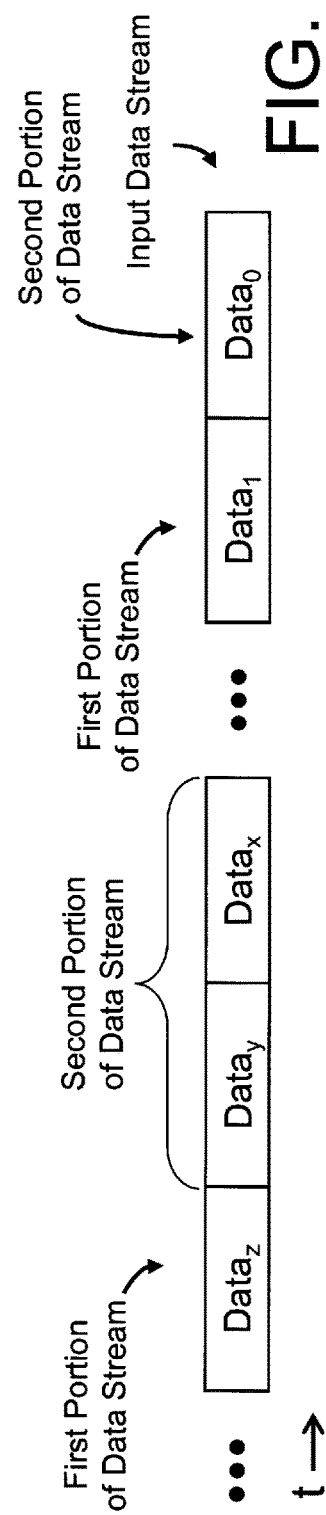

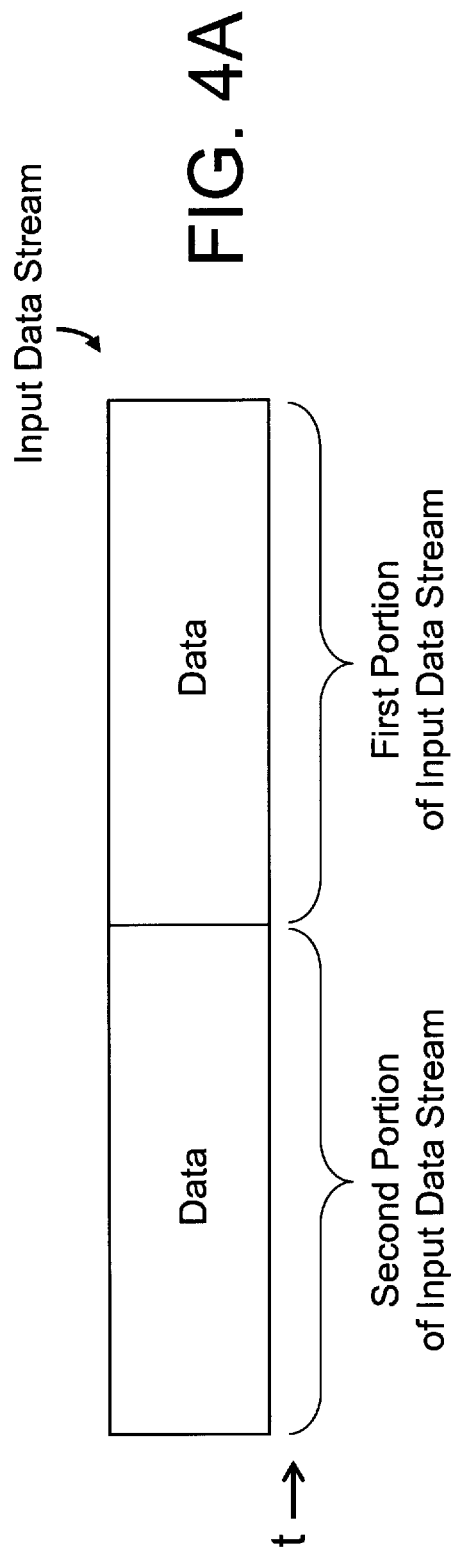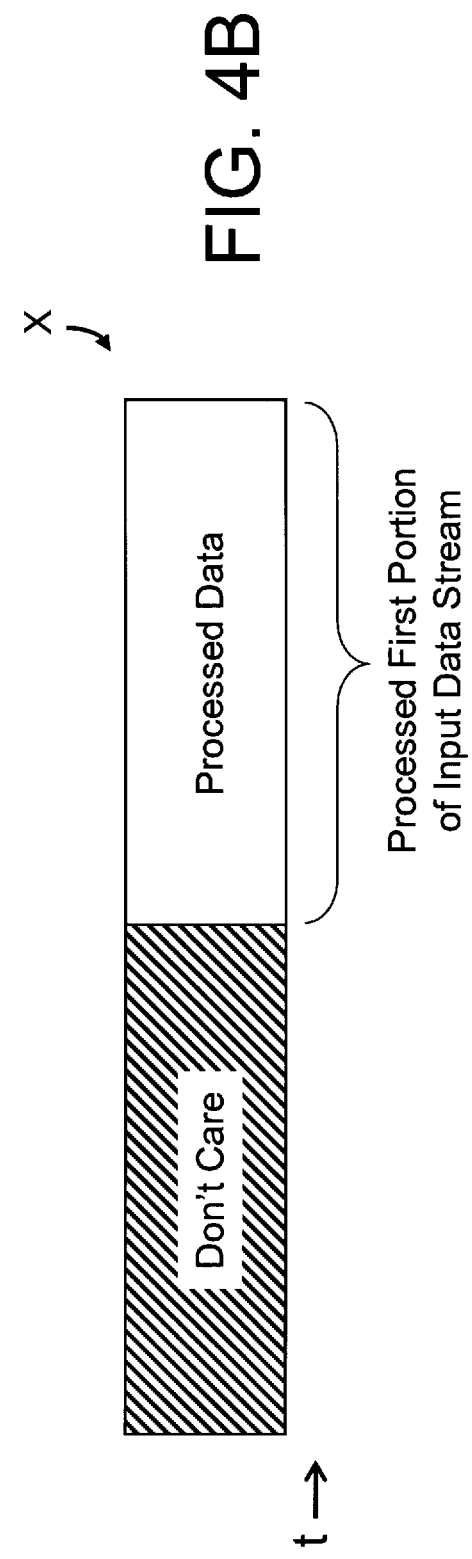

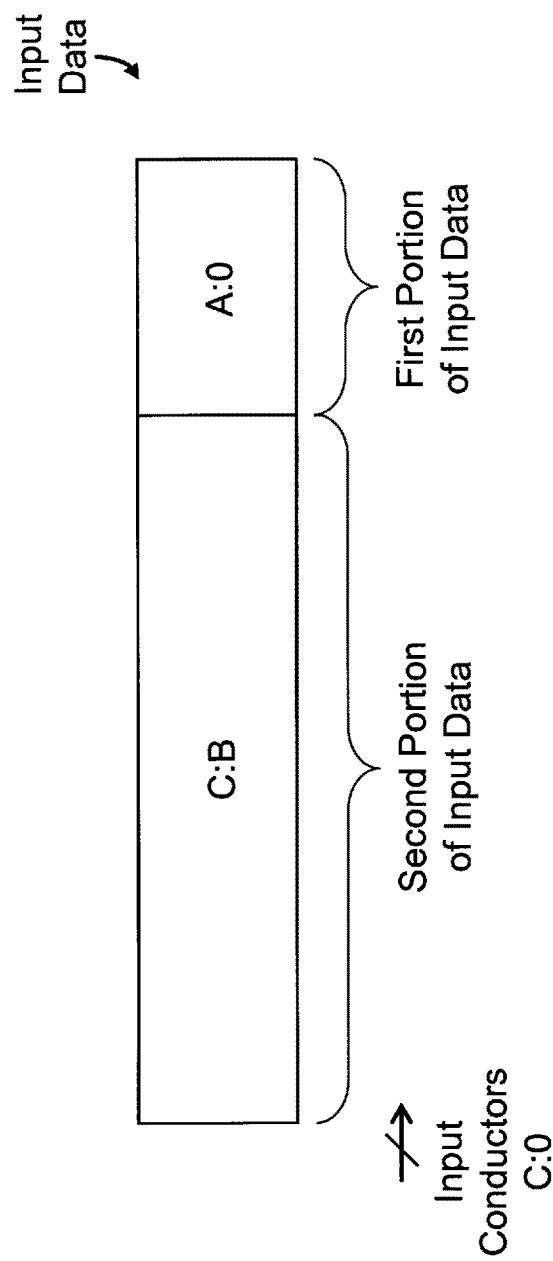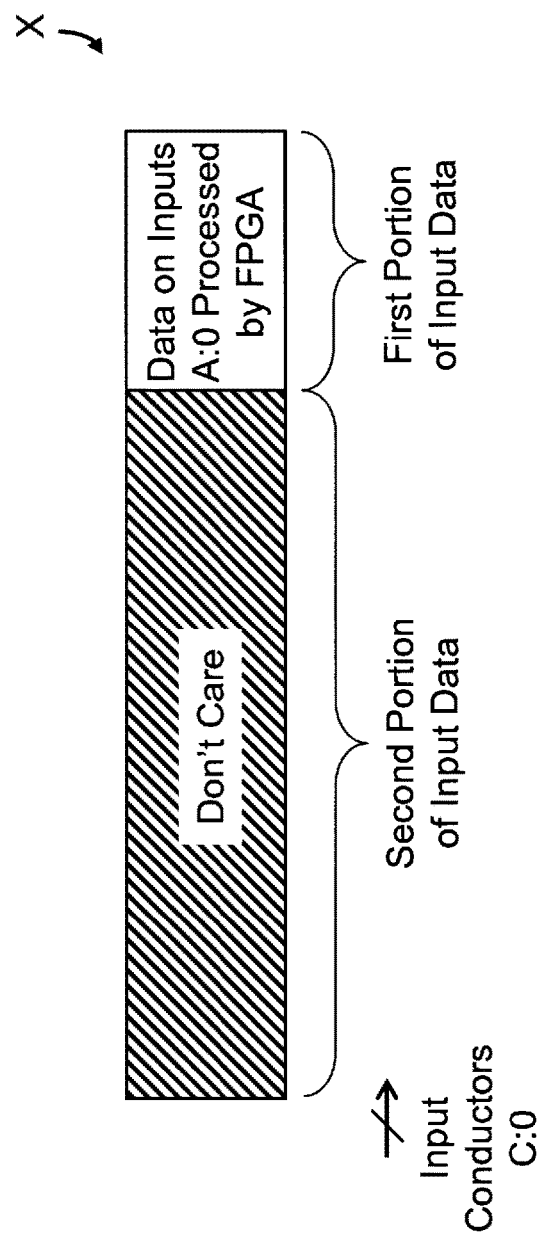

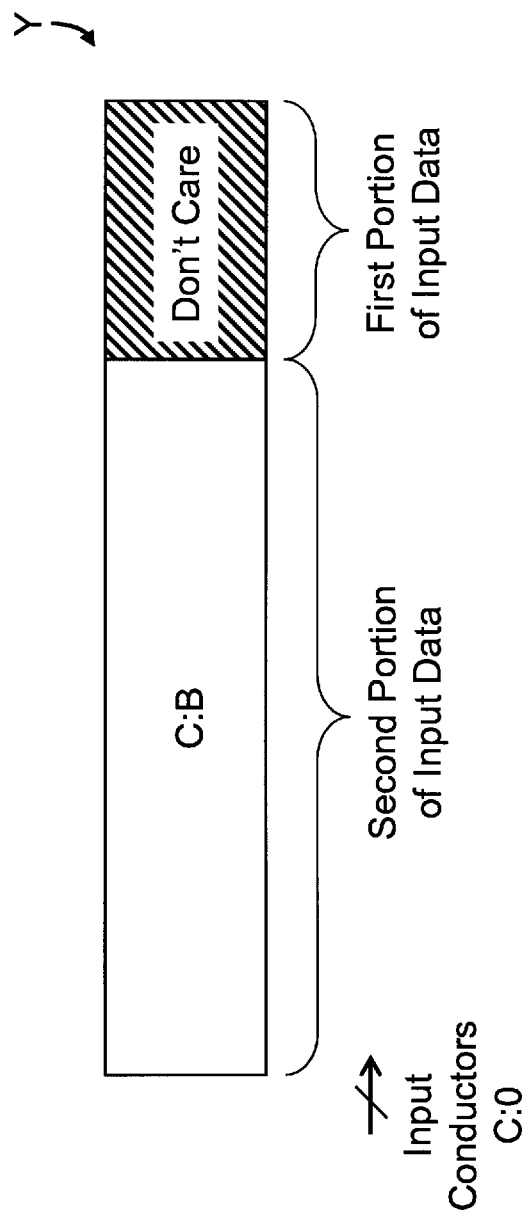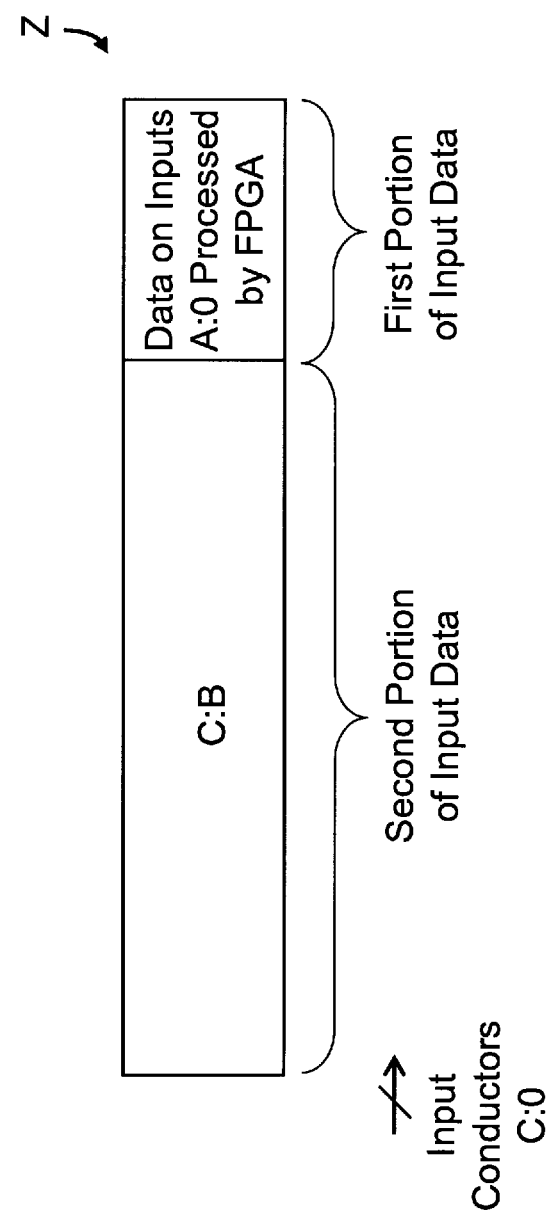

_US 10,867,096 B1_

FPGA IMPLEMENTING PARTIAL DATAPATH PROCESSING, AND METHOD OF OPERATING SAME

RELATED APPLICATION

This non-provisional application claims priority to and the benefit of U.S. Provisional Application No. 62/748,750, entitled "FPGA Implementing Partial Datapath Processing, and Method of Operating Same", filed Oct. 22, 2018. The '750 provisional application is incorporated herein by reference in its entirety.

INTRODUCTION

In one aspect, the present inventions are directed to an integrated circuit having circuitry, including a field programmable gate array ("FPGA"; e.g., embedded FPGA "(eFPGA") or discrete FPGA), implementing partial datapath processing and methods of programming such circuitry, for example, in situ programming (i.e., programming or re-programming during normal operation of the integrated circuit). For example, where an input data stream is applied to an FPGA, and a first portion of the data stream is processed in the FPGA (which has a configurable, re-configurable, and/or programmable (i.e., not fixed) path of data processing in relation to a data stream (e.g., the input data stream)), the circuitry and techniques of the present inventions may be employed to process and/or store data of the first portion of the data stream as intended/programmed by the FPGA while not processing and/or storing (e.g., "ignoring" and/or discarding) other portion(s) of the data stream (e.g., a second portion of the data stream) that is not processed or subject to processing by the FPGA. Here, a first portion of the data stream is provided to an FPGA (e.g., circuitry of the FPGA such as a logic circuitry, arithmetic operations circuitry, data processor, microcontroller, an accelerator, a data encryption engine, a filter, a DSP, and/or an encoder) which processes data of the first portion of the data stream (e.g., implements digital signal processing, encoding, decoding, encrypting, decrypting, filtering and/or other forms of data manipulation) to generate a processed first portion of the data stream. As for other data of the input data stream, the FPGA, in one embodiment, does not provide, assign, allocate and/or employ its resources to process, handle and/or manage the data of other portion(s) of the data stream (e.g., data of a second portion).

In addition, in one embodiment, the input data stream (or a selected/predetermined portion(s) or replica(s) thereof) is provided to other circuitry (e.g., an application specific integrated circuit ("ASIC") which, in one embodiment, has a fixed path of data processing in relation to a data stream (e.g., the input data stream)) including data alignment circuitry that temporarily stores the data of the other portion(s) of the input data stream (e.g., a second portion) and temporally aligns, synchronizes and/or delays the output of the data of the other portion(s) based on or relative to the processing of the data of the first portion of the data stream to facilitate subsequent combination of the portions of the data stream and/or construction or re-construction of a data stream including, for example, a first portion corresponding to data processed and/or stored by the FPGA and other portions not processed and/or stored by the FPGA. In one embodiment, the data alignment circuitry temporally synchronizes the output of the data of the other portion(s) of the input data stream to facilitate temporally integrating the other portions of the input data stream with the processed data stream generated and output by the FPGA (which includes the data of the processed first portion of the data stream, as processed by the FPGA) to "generate" a partially processed data stream (i.e., the data corresponding to the first portion has been processed). Here, in one embodiment, the data alignment circuitry temporarily stores the data of the other portion(s) of the data stream for an amount of time to "match" the amount of time employed by the FPGA to process the data of the first portion of the input data stream and output the processed first portion of the data stream. In another embodiment, the data alignment circuitry may temporarily store the data of the other portion(s) of the data stream for an amount of time for an amount of time that synchronizes with or correlates to the processing time of the FPGA.

Notably, the data alignment circuitry may include circuitry to mask, delete, discard and/or eliminate the data corresponding to or of the first portion of the data stream (i.e., that portion of the data stream that is processed by/in the FPGA). In one embodiment, the masking circuitry is disposed on the output of the data alignment circuitry to mask, delete and/or eliminate data corresponding to the data of the first portion of the input data stream (i.e., the portion of the input data stream that is undergoing processing in and modified by the FPGA). In another embodiment, the masking circuitry is disposed on the input of the data alignment circuitry to mask, delete, discard and/or eliminate data of the first portion from the input data stream (or a portion thereof) applied to other circuitry of the data alignment circuitry.

The circuitry of the present inventions may also include data combining circuitry to generate a partially processed data stream by combining (1) the portion of the data stream processed by the FPGA (i.e., the processed first portion of the data stream) and (2) the other portion(s) of the input data stream output/provided by the data alignment circuitry. Here, the data combining circuitry receives the processed first portion of the data stream or portion (i.e., the portion of the input data stream that is processed in the FPGA) and the other portion(s) of the input data stream (which, in one embodiment, includes the masked data corresponding to the first portion of the input data stream or portion) and generates or constructs a "new" data stream therefrom. In one embodiment, the data combining circuitry includes logic circuitry such as circuitry that performs an OR logic operation of the two data streams or portions (i.e., the processed first portion of the input data stream and the other portion(s) of the input data stream). In another embodiment, the data combining circuitry includes circuitry to partially concatenate the two data streams or portions (e.g., concatenating a portion of the data from the FPGA (i.e., the data processed by the FPGA) and a portion of the data from the data alignment circuitry (i.e., the data of the other portion(s)).

As intimated above, in one embodiment, the data alignment circuitry, masking circuitry and data combining circuitry may be circuitry disposed in an ASIC which is incorporated or manufactured in/on the integrated circuit of the present inventions. That is, in one embodiment, the integrated circuit of the present inventions includes an FPGA (e.g., and embedded FPGA) and an ASIC wherein the FPGA and ASIC, in operation, perform the processes or operations of the present inventions.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

BRIEF DESCRIPTION OF THE DRAWINGS

The present inventions may be implemented in connection with embodiments illustrated in the attached drawings. These drawings show different aspects of the present inventions and, where appropriate, reference numerals, nomenclature and/or names identifying or illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as ideal, preferred or advantageous, for example, over other embodiments or implementations; rather, it is intended reflect or indicate the embodiment(s) is/are "example" embodiment(s).

FIGS. 3A-3F are exemplary block diagram illustrations of exemplary input data including at least first and second portions thereof; notably, each portion of the multiple portions may be partially or fully contiguous or consecutive data bits of the input data received or acquired on the input conductors and/or may be partially or fully non-contiguous or non-consecutive bits received or acquired on the input conductors (see, e.g., FIG. 3F); the portions may be comprised of any combination of length and order of partial or full contiguous/consecutive input data—all of which are intended to fall within the scope of the present inventions; notably, FIGS. 3A-3C are generally applicable to FIGS. 4A-4D and FIGS. 3D-3F are generally applicable to FIGS. 5A-5D;

FIGS. 4A-4D are exemplary block diagram illustrations of an exemplary data stream of FIG. 3A at: (i) the input to the FPGA and data alignment circuitry (see FIG. 4A), (ii) the output of the FPGA, after processing by the FPGA (see FIG. 4B), (iii) at the output of the data alignment circuitry (see FIG. 4C), and at the output of the data combining circuitry (see FIG. 4D), according to certain aspects of the present inventions; notably, the recombined data illustrated in FIGS. 4A-4D are represented as a time domain recombination wherein data may arrive on the input conductors at the same or different times from the same or different sources; notably, the processed and unprocessed data may be recombined at the data combining circuitry in any order of processed and unprocessed data—which may or may not be predetermined or defined by the order of the data of the at least first and second portions of input data;

FIGS. 5A-5D are exemplary block diagram illustrations of an exemplary data on the data input conductors (e.g., input data bus) received at the same time including, for example, from multiple sources on different input conductors of, for example, the input data bus; in one embodiment, a first portion of the data is received or acquired on the input conductors from a first source and a second portion of the data is received or acquired on the input conductors from a second source (e.g., the input bus includes multiple input conductors (e.g., 32 bit input bus) wherein the 8 lower bits [7:0] are received from a first source while the 24 higher bits [31:8] are received from a second source); notably, the first portion of the data [A:0] may be received from a first source (or in one embodiment, a portion from a first source and a portion from a second source) and the second portion of the data [C:B] may be received from a second source (or in one embodiment, a portion from a second source and a portion from a first source);

Figure 1:
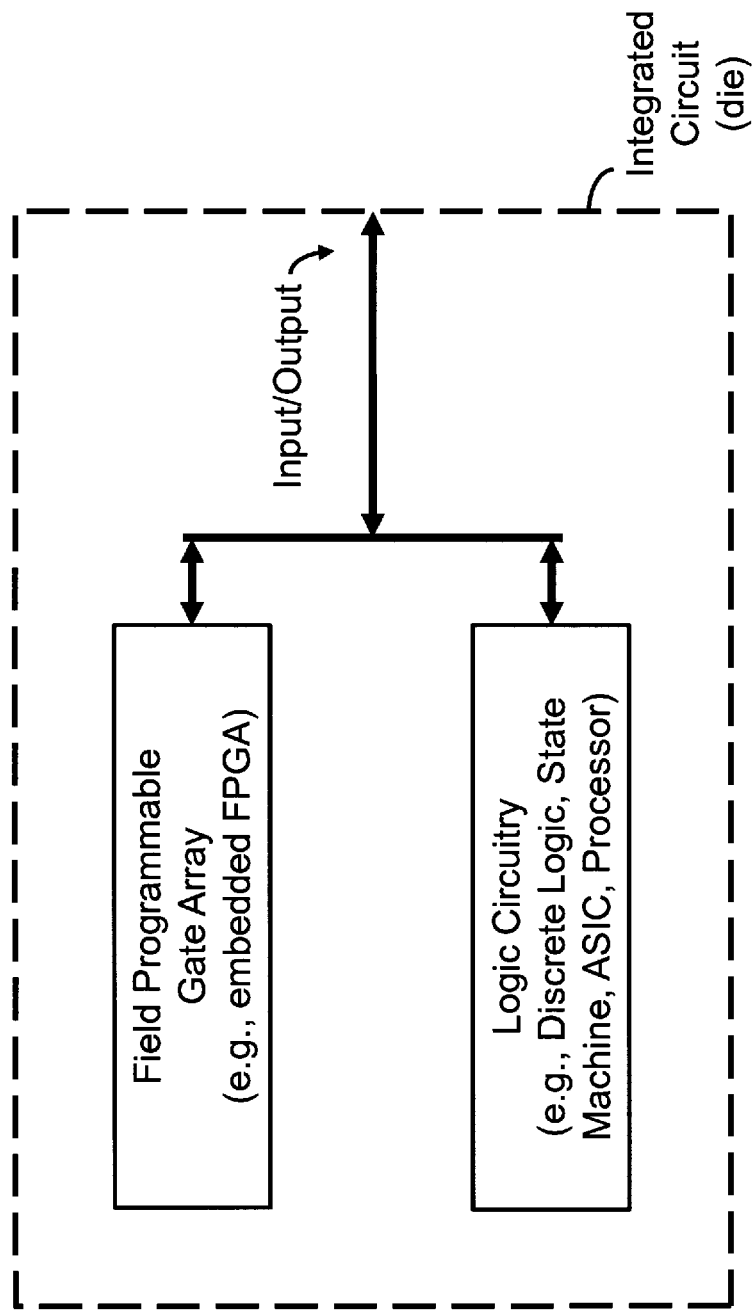
FIG. 1 illustrates a block diagram representation of an exemplary embodiment of an integrated circuit (disposed on or in one or more die), including an FPGA (e.g., an embedded FPGA ("eFPGA")) and logic circuitry (e.g., logic circuitry which has a fixed or substantially fixed path of data processing in relation to a data stream (e.g., the input data stream) and/or discrete logic, a state machine, ASIC and/or a processor) according to certain aspects of the present inventions; notably, in one embodiment, the FPGA includes a plurality of multiplexers configured in an switch interconnect network like that described and/or illustrated in U.S. Pat. No. 9,906,225.

Again, there are many inventions described and illustrated herein. An embodiment or implementation described herein as "exemplary" is not to be construed as ideal, preferred or advantageous, relative to other embodiments or implementations; rather, it is intended reflect or indicate the embodiment(s) is/are "example" or "illustrative" embodiment(s). Indeed, these inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations/permutations are not discussed separately herein.

DETAILED DESCRIPTION

In a first aspect, the present inventions are directed to an integrated circuit having circuitry, including a field programmable gate array ("FPGA"; e.g., embedded FPGA or discrete FPGA), to partially process a data stream. In another aspect, the present inventions are directed to methods of programming an integrated circuit having an FPGA to partial process an input data stream. In one embodiment, where an input data stream is provided to an FPGA, and a first portion of the data stream is processed in the FPGA, the circuitry and techniques of the present inventions provides the input data stream to the FPGA wherein it is processed, and other portion(s) of the input data stream are not processed and/or stored (i.e., the FPGA does not provide, assign, allocate and/or employ resources to handle and/or manage the data of other portion(s) of the data stream). The input data stream (or a selected/predetermined portion or replica thereof) is also provided to other circuitry on the integrated circuit (e.g., circuitry which has a fixed or substantially fixed path of data processing in relation to a data stream (e.g., the input data stream) for example, an ASIC—which, in one embodiment, has a fixed path of data processing in relation to a data stream) including data alignment circuitry that temporarily stores the data of the other portion(s) of the input data stream (e.g., data of the other portion(s)) and temporally aligns, synchronizes and/or delays the output of the data of the other portion(s) based on or relative to the processing of the data of the first portion of the data stream to facilitate subsequent construction or re-construction of a data stream, for example, a data stream including a combination of the processed portions of the input data stream (i.e., data processed by the FPGA) and other portion(s) of the input data stream (portion(s) not processed by the FPGA).

The data of the other portion(s) of the input data stream are handled or managed by the data alignment circuitry which, as mentioned above, temporarily stores the data of the other portion(s) of the data stream. In one embodiment, the data alignment circuitry temporarily stores the data of the other portion(s) of the data stream for an amount of time to "match" the amount of time employed by the FPGA to process the data of the first portion of the input data stream and output the processed first portion of the data stream. In another embodiment, the data alignment circuitry may temporarily store the data of the other portion(s) of the data stream for an amount of time that synchronizes with or correlates to the processing time of the FPGA in order to, for example, construct or re-construct a data stream including data corresponding to the first portion of the input data stream (data of the first portion that is processed by the FPGA) and data of the other portions of the data stream.

The data combining circuitry may generate, construct and/or re-construct a "new" data stream (including data corresponding to the first portion that has been processed by the FPGA). Here, the data combining circuitry may generate or construct a partially processed data stream by combining (1) the portion of the data stream, as processed by the FPGA (i.e., the processed first portion of the data stream) and (2) the other portion(s) of the input data stream output/provided by the data alignment circuitry. For example, in one embodiment, the data combining circuitry receives the processed first portion of the data stream (i.e., the portion of the input data stream that is processed in the FPGA) and the other portion(s) of the input data stream (which, in one embodiment, includes the masked data corresponding to the first portion of the input data stream) and generates or constructs a data stream therefrom.

Notably, the data alignment circuitry may include circuitry to mask, delete and/or eliminate the data corresponding to or of the first portion of the data stream (i.e., that portion of the data stream that is processed by/in the FPGA) from the input data stream (or a portion thereof) applied to data alignment circuitry. In one embodiment, the masking circuitry is disposed on the output of the data alignment circuitry to mask, delete and/or eliminate data corresponding to the data of the first portion of the input data stream (i.e., the portion of the input data stream that is undergoing processing in and modified by the FPGA). In another embodiment, the masking circuitry is disposed on the input of the data alignment circuitry to mask, delete, discard and/or eliminate data of the first portion from the input data stream (or a portion thereof) applied to other circuitry of the data alignment circuitry.

With reference to FIG. 1, in one embodiment, the present invention is an integrated circuit having an FPGA and other logic circuitry (e.g., an ASIC) disposed therein/thereon. Data, including an input data stream, may be provided to the integrated circuit for processing via input/output (which is generally illustrated). Notably, in one embodiment, the input data stream is provided external to the integrated circuit; in another embodiment, the input data stream is generated and/or provided by circuitry on/in (i.e., internal) to the integrated circuit. To be sure, the circuitry and techniques of the present inventions are also applicable to both embodiments.

Figure 4C:
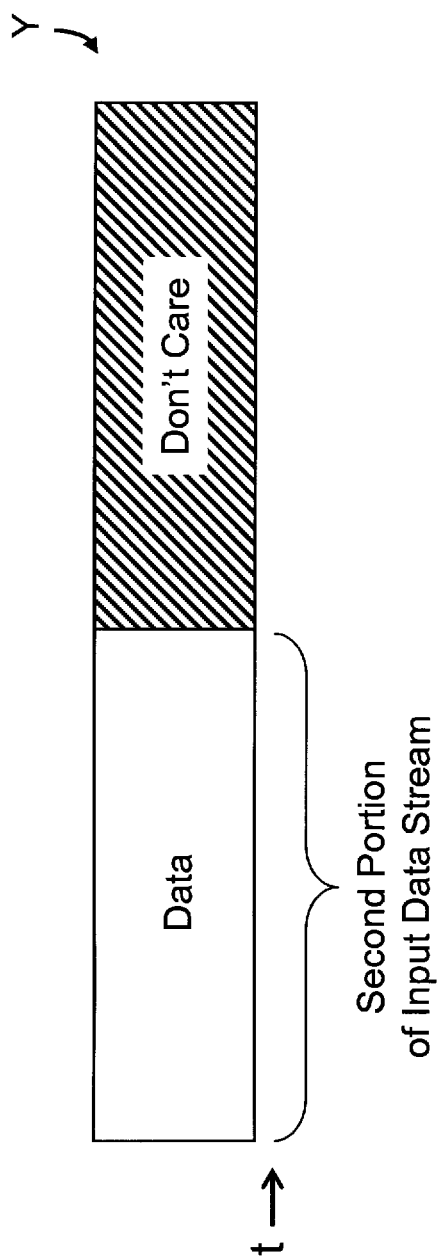
Figure 4D:
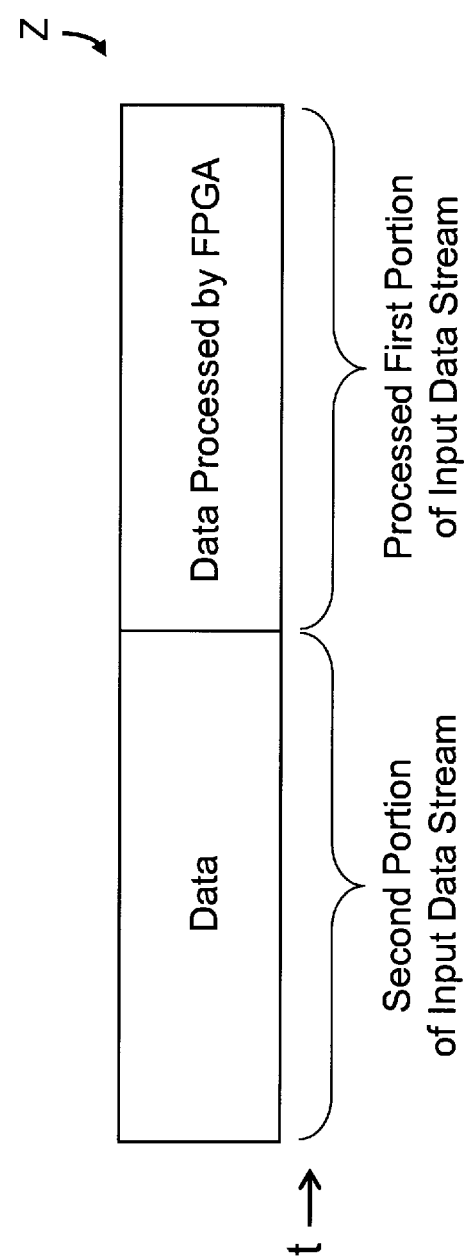

With reference to FIGS. 2A, 3A-3F, 4A-4D and 5A-5D, in one embodiment, the input data stream is provided to the FPGA and the data alignment circuitry. Circuitry of the FPGA, such as a logic circuitry, arithmetic operations circuitry, data processor, microcontroller, an accelerator, a data encryption engine, a filter, a DSP, and/or an encoder) may employ its resources to process the data of the first portion of the data stream. (See, also, FIGS. 4B and 5B). For example, such circuitry may implement digital signal processing, encoding, decoding, encrypting, decrypting, filtering and/or other forms of data manipulation to generate a processed first portion of the data stream. Notably, all forms or types of processing, whether now known or later developed, are intended to fall within the scope of the present inventions.

Notably, in one embodiment, the FPGA includes a plurality of multiply-accumulator circuits to process data—including the first portion of the input data stream. For example, the FPGA may include a plurality of multiply-accumulator circuits (among other circuitry) as described and/or illustrated in U.S. patent application Ser. No. 16/545,345, filed on Aug. 20, 2019 (which, as noted above, is incorporated herein by reference in its entirety) to perform multiply and accumulate operations. In one embodiment, the multiplier-accumulator circuitry of the '345 application includes a plurality of separate multiplier-accumulator circuits and a plurality of registers (including a plurality of shadow registers) to facilitate pipelining of the multiply and accumulate operations. Moreover, the multiplier-accumulator circuitry may be organized, configured and interconnected to implement multiply and accumulate operations in a concatenating manner thereby allowing a plurality of multiplier-accumulator circuitry to perform multiply and accumulate operations more rapidly.

The data alignment circuitry also receives the input data stream (or a selected/predetermined portion or replica thereof). In one embodiment, the data alignment temporarily stores the data of the other portion(s) of the input data stream (e.g., a second portion) and, based on the processing time of the data of the first portion of the data stream (in the FPGA), temporally aligns, synchronizes and/or delays the output of the data of the other portion(s). Here, the data alignment temporarily stores the data of the other portion(s) of the data stream for an amount of time to "match" the amount of time required by the FPGA to process the data of the first portion of the input data stream and output the processed first portion of the data stream to facilitate subsequent combination of the portions into a partially processed data stream. In another embodiment, the data alignment circuitry may temporarily store the data of the other portion(s) of the data stream for an amount of time that synchronizes with or correlates to the processing time of the FPGA in order to, for example, construct or re-construct a data stream including data corresponding to the first portion of the input data stream (data of the first portion that is processed by the FPGA) and data of the other portions of the data stream.

Figure 2A:
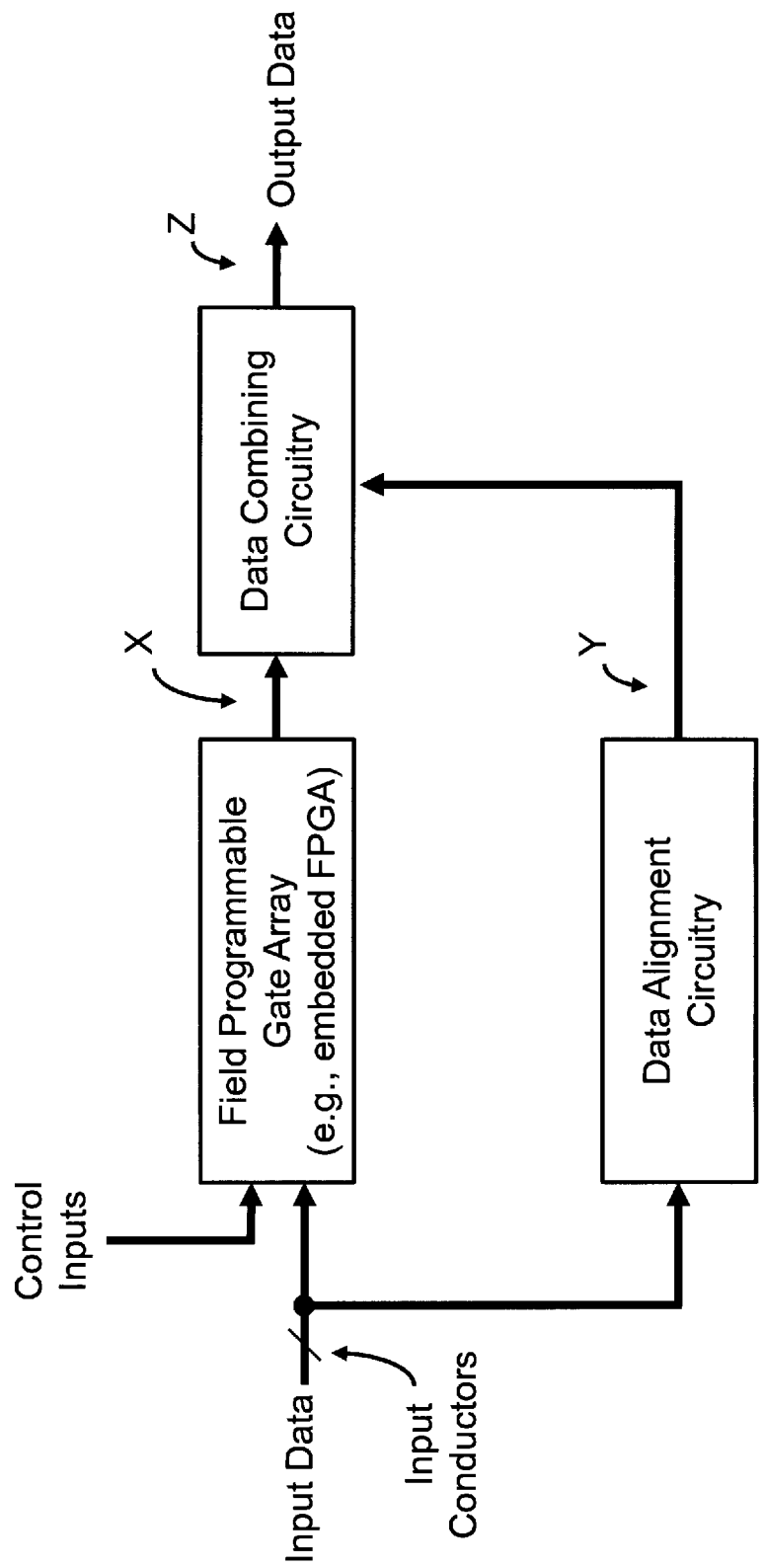
FIG. 2A illustrates a block diagram representation of an exemplary embodiment of a circuit according to certain aspects of the present inventions, wherein, in this exemplary embodiment, the FPGA and data alignment circuitry (which, in operation, are programmed to a condition or in a manner or state according to certain aspects of the present inventions) receive an input data stream wherein the FPGA performs processing (e.g., digital signal processing, encoding, decoding, encrypting, decrypting and/or other forms of data manipulation) on data of a first portion of the data stream to generate a processed first portion of the data stream and data alignment circuitry receives data of a second portion of the data stream; notably, in one embodiment, the FPGA includes a plurality of multiply-accumulator circuits to process data; indeed, in one embodiment, the FPGA includes a plurality of multiply-accumulator circuits (among other circuitry) as described and/or illustrated in U.S. patent application Ser. No. 16/545,345, filed on Aug. 20, 2019, which is incorporated herein by reference in its entirety.
Figure 2B:
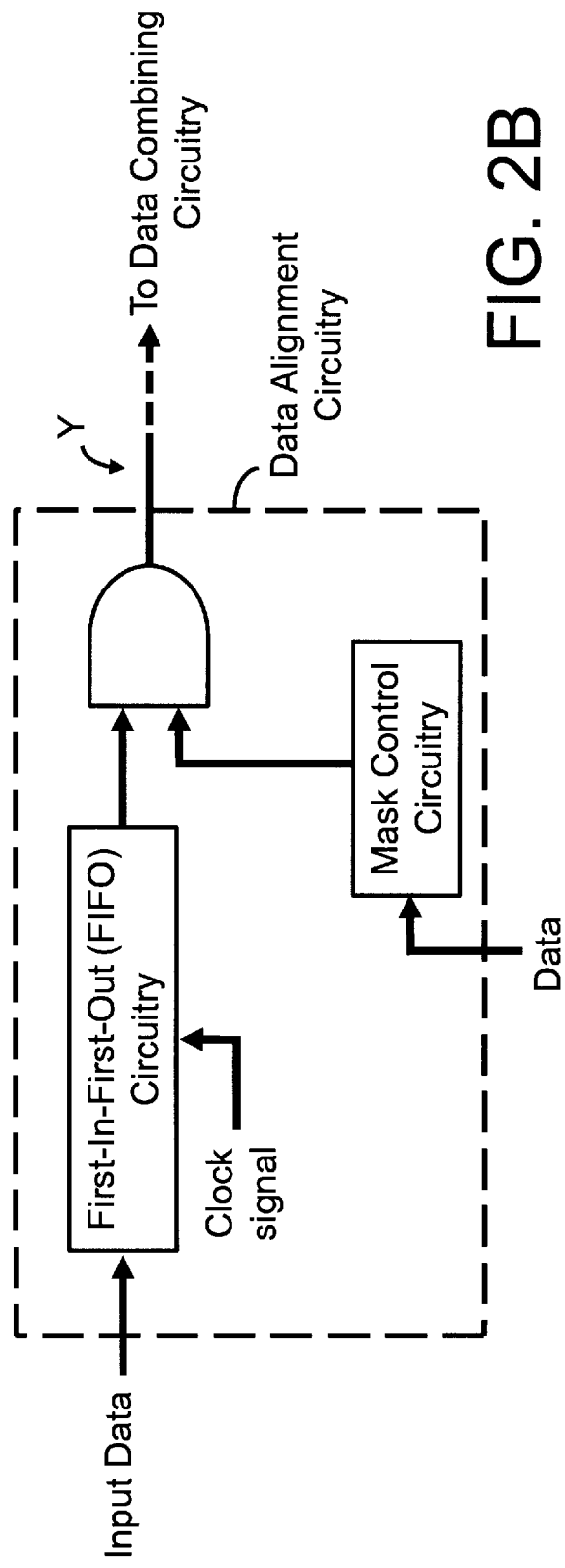
FIG. 2B illustrates a block and diagram representation of an exemplary embodiment of the data alignment circuitry according to certain aspects of the present inventions wherein, in one embodiment, the data alignment circuitry receives the input data stream (or a portion or replica thereof), stores the data of the input data stream (or a portion thereof), and temporally synchronizes, aligns and/or delays the data of the other portion(s) of the data stream to "match", synchronize and/or correlate to the processing time of the data of the first portion of the data stream); in one embodiment, the data alignment circuitry also includes circuitry to mask, delete and/or eliminate the data of the first portion of the data stream (i.e., that portion of the data stream that is processed by/in the FPGA) from the input data stream (or a portion thereof); in one embodiment, the data alignment circuitry outputs the data of at least the other portion(s) of the data stream to data combining circuitry to, for example, integrate the data of the other portion(s) of the data stream with the processed data of the first portion of the input data stream generated and output by the FPGA (i.e., the data of the first portion of the data stream, as processed by the FPGA—that is, the processed first portion of the input data stream); in another embodiment, data alignment circuitry may temporarily store the data of the other portion(s) of the data stream for an amount of time for an amount of time that synchronizes with the amount of time the FPGA employs to process the data of the first portion of the input data stream and output the processed first portion of the data stream.

With reference to FIGS. 2A and 2B, in one embodiment, the data alignment circuitry includes mask control circuitry to mask, delete, discard and/or eliminate the data of the first portion of the data stream (i.e., that portion of the data stream that is processed by/in the FPGA). In one embodiment, the mask control circuitry is disposed on the output of the data alignment circuitry to mask, delete and/or eliminate data corresponding to the data of the first portion of the input data stream (i.e., the portion of the input data stream that is undergoing processing in and modified by the FPGA). (See, also, FIGS. 4C and 5C). In this embodiment, the data of the first portion of the input data stream is masked before providing the data combining circuitry.

Notably, the masking circuitry may be disposed on the input of the data alignment circuitry. The masking circuitry, as in the embodiment where it is located on the output of the data alignment circuitry, masks, deletes, discards and/or eliminates data of the first portion from the input data stream (or a portion thereof) before such data is available to certain other circuitry of the data alignment circuitry.

Figure 2D:
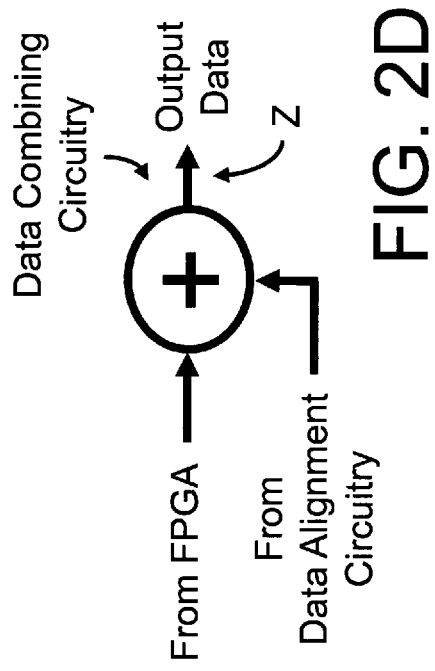
FIG. 2D illustrates a circuit diagram representation of another exemplary embodiment of the data combining circuitry according to certain aspects of the present inventions wherein, in one embodiment, the data combining circuitry (e.g., circuitry that performs an concatenating operation/function with respect to a portion of data from the FPGA and data from the data alignment circuitry) employed to generate a partially processed data stream by constructing a data stream using the first portion of the data stream, as processed by the FPGA (i.e., the processed first portion of the input data stream) and (2) other portion(s) of the data stream aligned (which may or may not be processed), for example, by combining (1) data of the first portion of the data stream, as processed by the FPGA (i.e., the processed first portion of the input data stream) and (2) other portion(s) of the data stream aligned, delayed, synchronized and/or output by the data alignment circuitry.
Figure 2C:
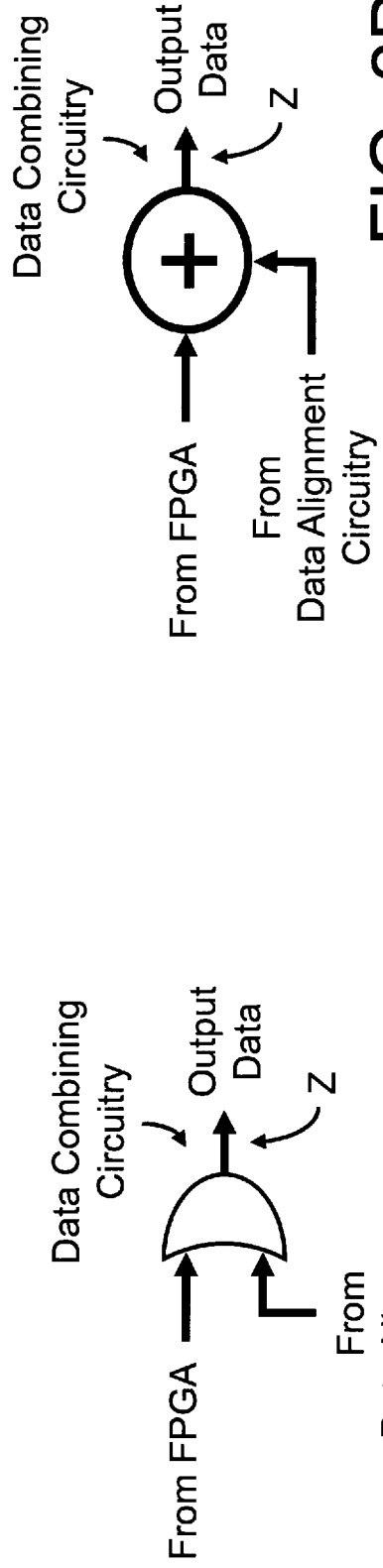
FIG. 2C illustrates a circuit diagram representation of an exemplary embodiment of the data combining circuitry according to certain aspects of the present inventions wherein, in one embodiment, the data combining circuitry (e.g., logic circuitry such as circuitry that performs an OR logic function) is employed to generate a partially processed data stream by constructing a data stream using the first portion of the data stream, as processed by the FPGA (i.e., the processed first portion of the input data stream) and (2) other portion(s) of the data stream aligned (which may or may not be processed), for example, by combining (1) data of the first portion of the data stream, as processed by the FPGA (i.e., the processed first portion of the input data stream) and (2) other portion(s) of the data stream aligned, delayed, synchronized and output by the data alignment circuitry.
Figure 3D:
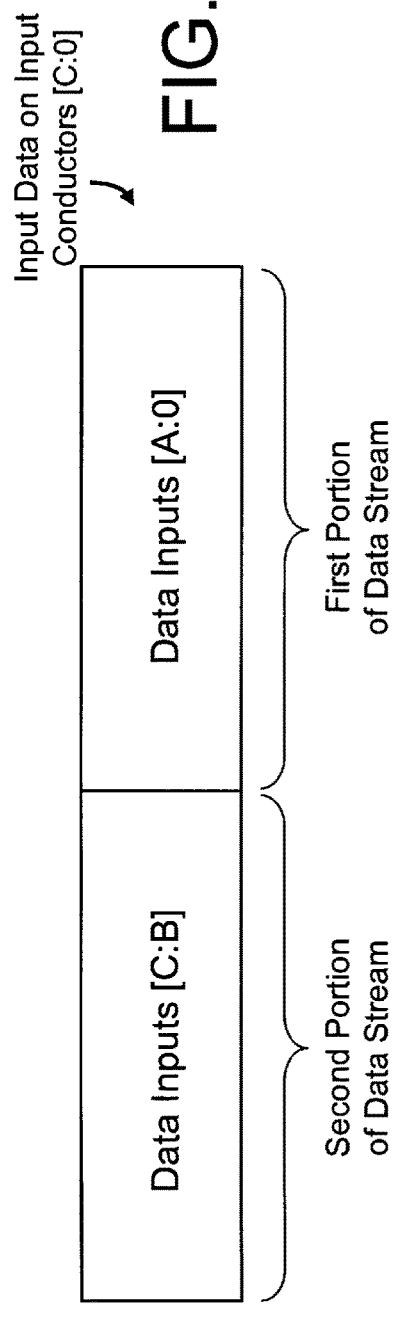
Figure 3E:
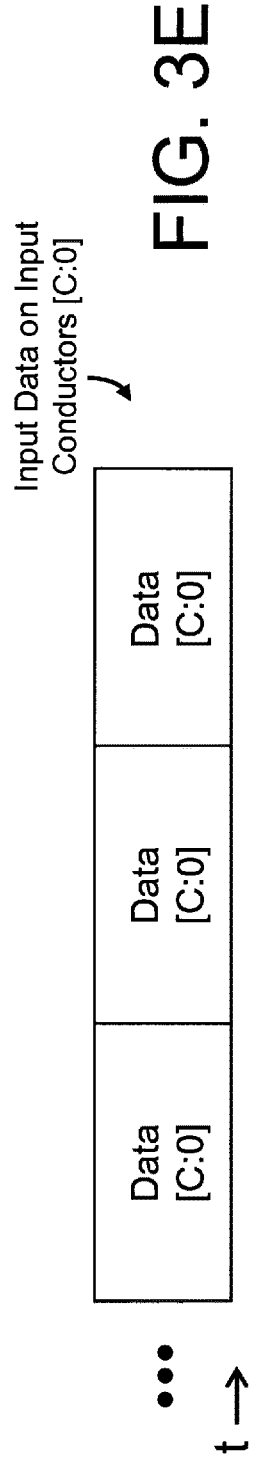
Figure 3F:
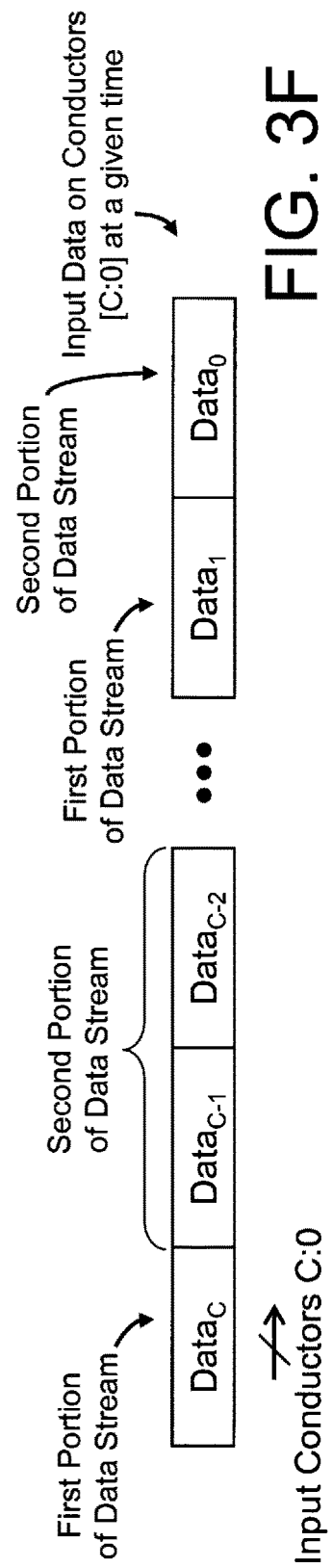

With reference to FIGS. 2A and 2C, the data combining circuitry receives the processed data of the first portion of the data stream and the data of the other portion(s) of the input data stream from the data alignment circuitry, which is temporally synchronized with the processing time of the data processed by the FPGA which generates a partially processed data stream (the data corresponding to the first portion having been processed). (See, FIGS. 4D and 5D). Here, the data combining circuitry generates a partially processed data stream by combining (1) the portion of the data stream, as processed by the FPGA (i.e., the processed first portion of the data stream) and (2) the other portion(s) of the input data stream output/provided by the data alignment circuitry. The data combining circuitry receives the processed first portion of the data stream and the other portion(s) of the input data stream (which, in one embodiment, includes the masked data corresponding to the first portion of the input data stream) from the data alignment circuitry and generates a data stream therefrom. In one embodiment, the data combining circuitry includes logic circuitry such as circuitry that performs an OR logic operation of the two data streams (i.e., the processed first portion from the FPGA and the other portion(s) from the data alignment circuitry).

Notably, the data combining circuitry may be any circuitry now known or later developed to combine the portion of the data from the FPGA and the portion(s) from the data alignment circuitry. For example, in another embodiment, the data combining circuitry includes circuitry to concatenate the two data streams or portions (e.g., concatenating data from the FPGA (i.e., the data processed by the FPGA) and/with data from the data alignment circuitry (i.e., the data of the other portion(s)). (See, FIG. 2D).

With particular reference to FIGS. 5A-5D, the input data applied to, received on the inputs (e.g., the input data bus) may be composed of multiple sources (e.g., the inputs receives a first portion of data provided from or output by a first source and a second portion of data provided from or output by a second source). For example, in one embodiment, the input data may be received on an input bus (e.g., 32 bit input bus) wherein the FPGA processes the data on input conductors [7:0] and the remaining input conductors [31:8] are not processed by the FPGA. In this exemplary embodiment, the 32 bits are applied to the data alignment circuitry and FPGA wherein the FPGA will processes bits [7:0] only. Thereafter, the processed data is recombined with the data from the data alignment circuitry to "reconstruct" or "build" the 32 bit bus as a combination of [31:8] from data alignment circuitry and [7:0], as processed, from FPGA.

Figure 6A:
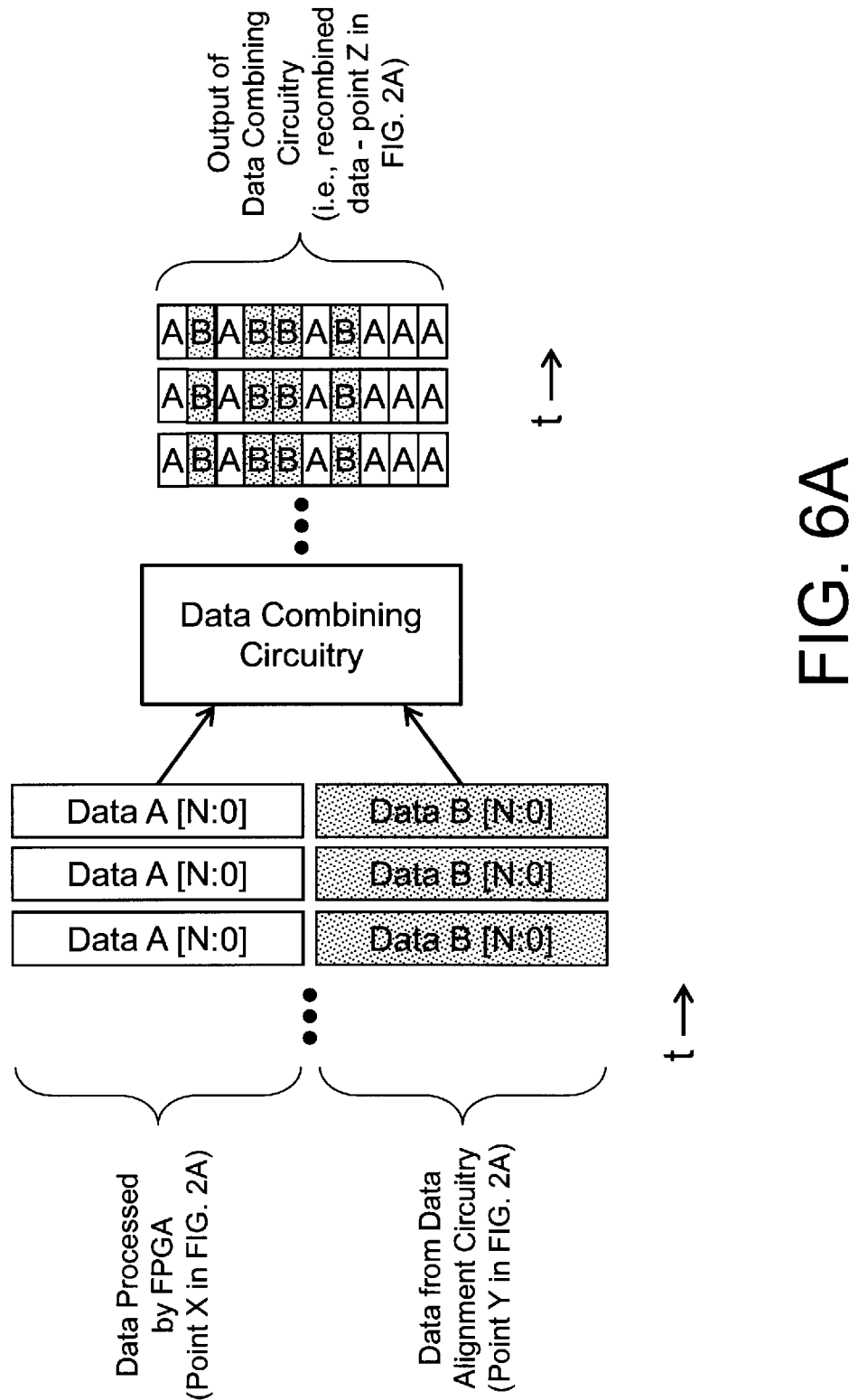
FIGS. 6A-6C are exemplary block diagrams illustration of the recombination, by the data combining circuitry, of the multiple portions of the data received or acquired on the input conductors from multiple sources (e.g., first and second sources)—after processing of certain data by the FPGA; here, certain of the input data is processed by the FPGA wherein that data may or may not be contiguous or consecutive data bits of the input data received or acquired on the input conductors; moreover, as intimated above, the recombined data may consist of any combination of processed and unprocessed data; indeed, in one embodiment, certain data that is processed by the FPGA may or may not maintain the original/initial position of the data in the data packet (received on the input conductors at a given time); the ordering of the processed and unprocessed data may be implemented by (1) the data alignment circuitry (which may introduce a delay of data that correlates to (but does not fully or exactly match) the processing time of the data in the FPGA and/or (2) the data combining circuitry; notably, any combination of the FPGA processed and FPGA unprocessed data is intended to fall within the scope of the present inventions; labeling the data as Data[C:B] and Data [A:0] (see, e.g., FIG. 5D) should not be interpreted as requiring or implying a fixed reconstruction or recombination (i) order or manner of such portions of data by the data combining circuitry (e.g., concatenating, interleaving or the like)—or (i) amount of data of one or more (or all) of the portions of data, unless stated otherwise.
Figure 6B:
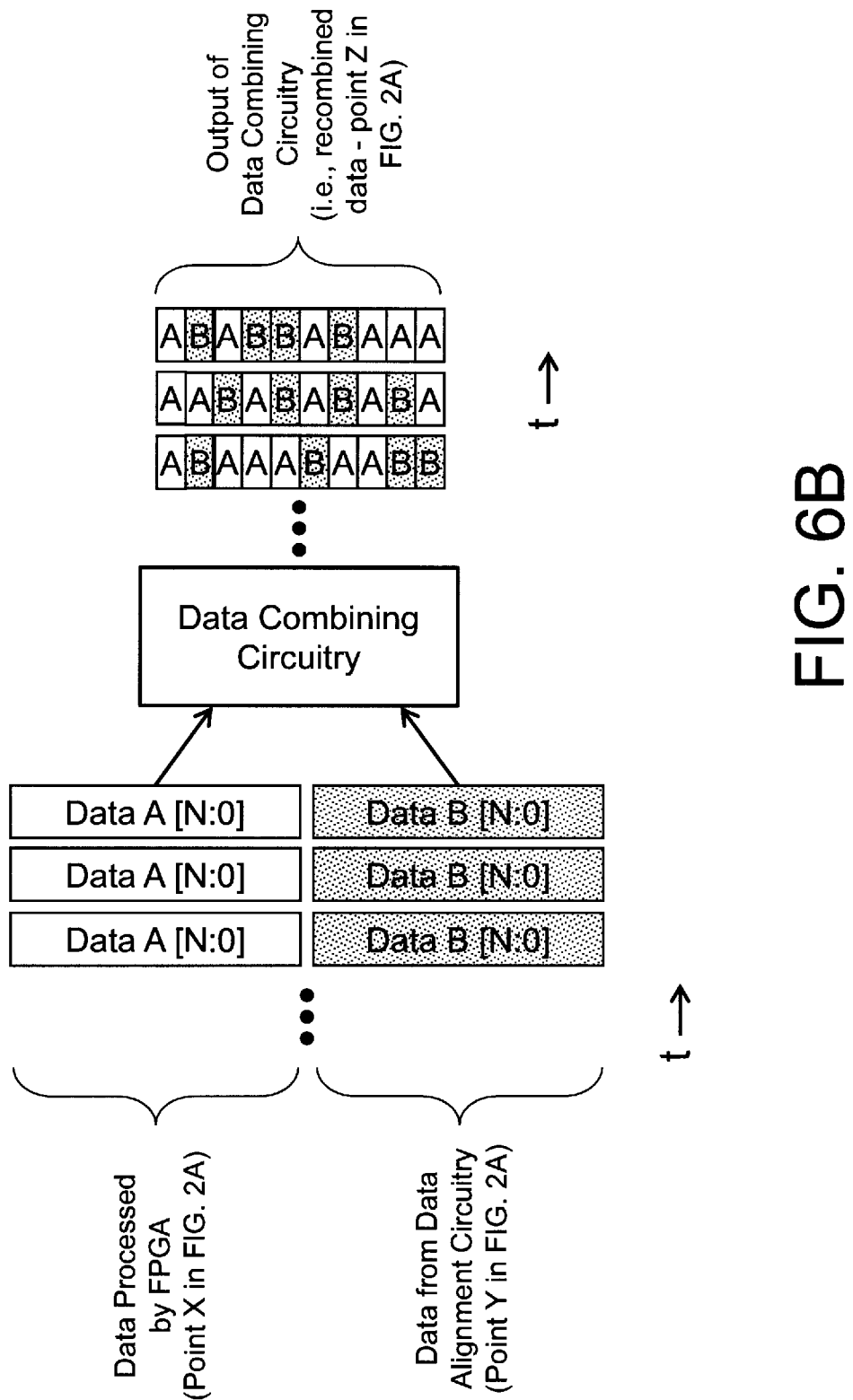
Figure 6C:
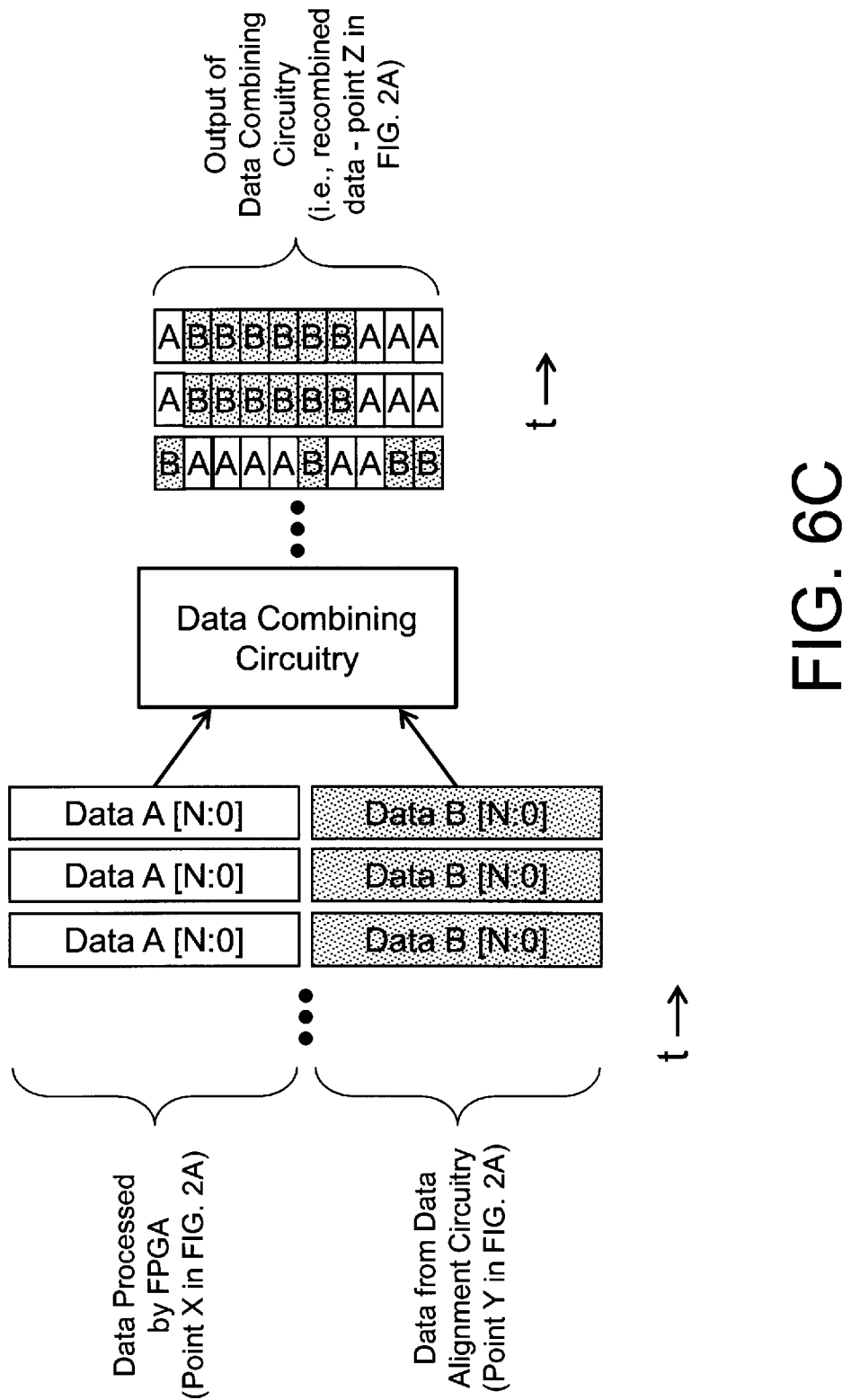

With reference to FIGS. 6A-6C, the multiple portions of the data, after processing by the FPGA, at the output of the data combining circuitry may or may not correlate to the multiple portions of data received or acquired on the input conductors from multiple sources (e.g., first and second sources). Here, the data can be recombined from any combination of the processed and unprocessed data. For example, certain data that is processed by the FPGA may or may not be contiguous or consecutive data bits of the input data received or acquired on the input conductors. Moreover, as intimated above, certain data that is processed by the FPGA may or may not maintain the original/initial position of the data in the data packet (received on the input conductors at a given time). The ordering of the processed and unprocessed data may be implemented by the data alignment circuitry (which may introduce a delay of data that correlates to (but does not fully or exactly match) the processing time of the data in the FPGA and/or the data combining circuitry. Any combination of the FPGA processed and FPGA unprocessed data is intended to fall within the scope of the present inventions; indeed, such combinations may change from packet to packet in situ (compare FIG. 6A with FIGS. 6B and 6C).

Figure 7:
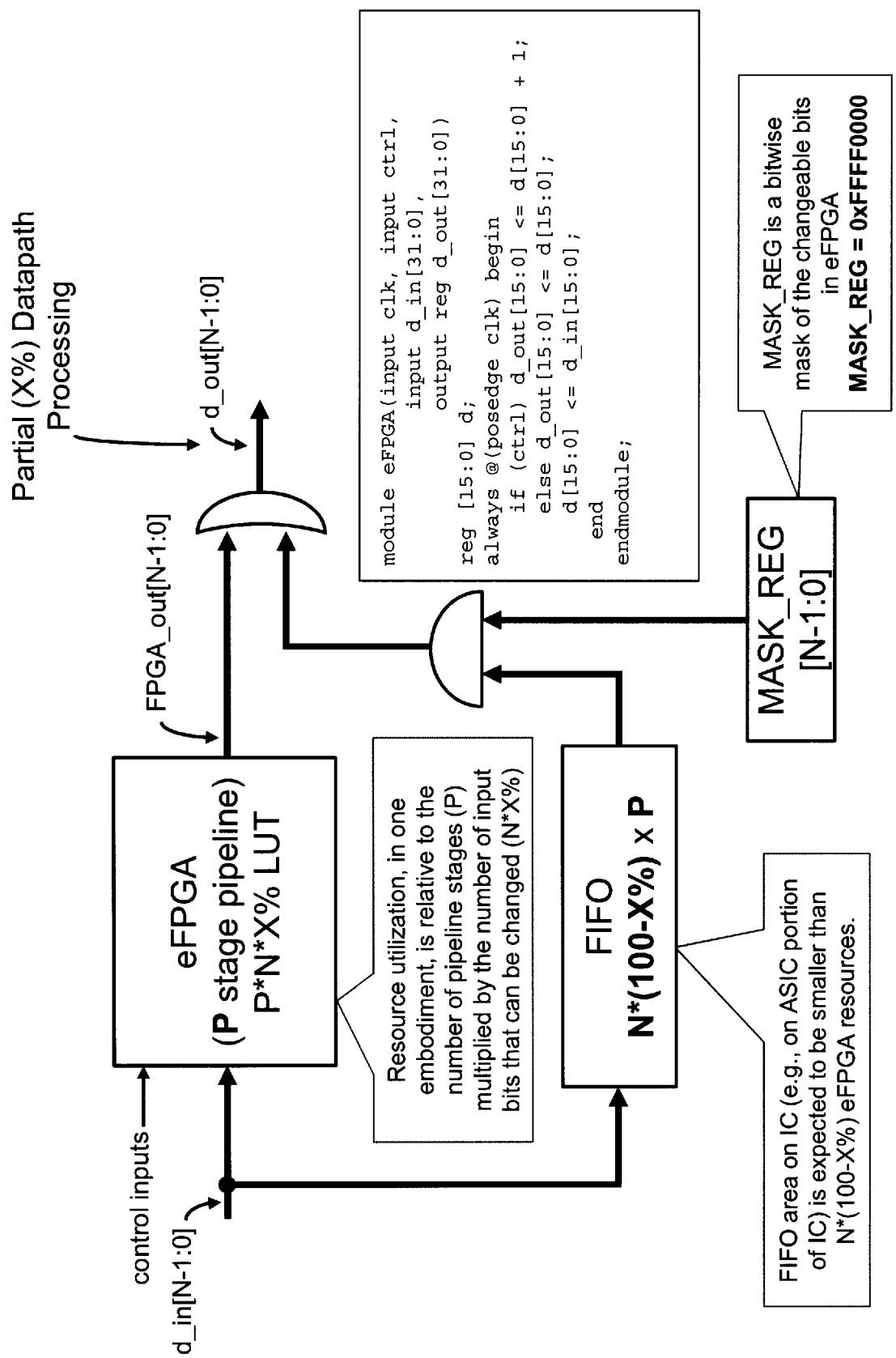
FIG. 7 is an annotated block diagram illustration of an exemplary embodiment of the circuit of FIG. 2A according to certain aspects of the present inventions, wherein, in this illustration, annotation is provided to reflect exemplary percentages of certain partial datapath processing implemented thereby (and the impact thereof); also illustrated are certain exemplary control inputs (see, e.g., the MASK_REG) and code.

With reference to FIG. 7, in one exemplary embodiment of the circuit block diagram of FIG. 2A, the data combining circuitry is represented as an OR logic circuit and data alignment is represented as a FIFO circuit and the mask control circuitry is represented as a register. Under these general circumstances, annotation is provided therein to reflect exemplary percentage calculation technique of partial datapath processing implemented by such exemplary circuit (and the impact thereof). The percentages are merely exemplary representations and not intended to limit the breath of the inventions.

In sum, in the present invention, the FPGA, in one embodiment, provides, assigns, allocates and/or employs resources to handle and/or manage the data of the first portion of the data stream and does/need not provide, assign, allocate and/or employ resources to handle and/or manage the data of other portion(s) of the data stream (e.g., data of a second portion).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, in any and all embodiments of the present inventions, the input data may originate or be provided, received and/or acquired from one, two, three or more sources. As such, although certain inventions are described and illustrated as receiving or acquiring portions of data from two sources, more or less than two sources may provide such data. For the sake of brevity, such embodiments will not be restated in connection with the input data originating or provided, received and/or acquired from more or less than two sources.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Notably, in addition to synchronizing the data of the other portion(s) of the input data stream to correlate with the processing time of the FPGA of the first portion of the data stream, one or more of the other portion(s) of the data (not processed in the FPGA) may be processed as well, for example, within an ASIC. In this embodiment, the data combining circuitry may subsequently combine (1) the data of the processed first portion of the data stream and (2) processed and/or unprocessed data of one or more other portion(s) of the input data stream. The processing of the data of the first portion and other portion(s) may be any type, whether now known or later developed, including—for example—filtering, digital signal processing, encoding, decoding, encrypting, decrypting and/or any other forms of data manipulation. Indeed, in one embodiment, where the data alignment circuitry, masking circuitry and data combining circuitry are circuitry disposed in an ASIC (which, in one embodiment, has a fixed path of data processing in relation to a data stream (e.g., the input data stream)), it may be advantageous to process one or more other portion(s) of the input data stream therein.

Further, as intimated above, in one embodiment, the data alignment circuitry, masking circuitry and data combining circuitry may be circuitry disposed in an ASIC which is incorporated or manufactured in/on the integrated circuit of the present inventions. That is, in one embodiment, the integrated circuit of the present inventions includes an FPGA (e.g., and embedded FPGA) and an ASIC wherein the FPGA and ASIC, in operation, perform the processes or operations of the present inventions Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The techniques described herein may be implemented using control circuitry (e.g., one or more processors (suitably programmed)) to perform, execute and/or assess one or more of the functions or operations described herein to program the data storage elements and thereby configure the robust type memory cell according to the present inventions. Here, the control circuitry (which may be disposed on the integrated circuit) is employed to program the robust type memory cell during initialization or at start-up, and/or in situ such that the output of the robust type memory cell is employed to establish or implement a mode of operation or function in, for example, the logic tile.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

Notably, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Further, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, in the claims and elsewhere, the term "logic tile" means a design unit or block of a plurality of transistors (typically more than thousands), which, in this application, is capable of connecting to one or more neighboring logic tiles, logic cells, logic cores or logic blocks. The term "integrated circuit" means, among other things, a processor, controller, state machine, gate array, SOC, PGA and/or FPGA. The term "integrated circuit" also means, for example, a processor, controller, state machine and SoC— including an embedded FPGA. For the avoidance of doubt, field programmable gate array or FPGA means both an FPGA and an embedded FPGA.

In addition, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like). The term data processing operations means operations including digital signal processing, encoding, decoding, encrypting, decrypting, multiply-accumulate operations and/or other forms of data manipulation. The term "temporally synchronizes" means temporally aligns, synchronizes and/or delays. The term "to delete the data" means to mask, delete, discard and/or eliminate the data.

What is claimed is:

1. An integrated circuit comprising:
   an FPGA including:
      an input to receive an input data stream wherein the input data stream includes a first portion and a second portion;
      logic circuitry to generate a processed data stream by processing only the first portion of the input data stream via first data processing operation;
      an output to output the processed data stream;
   an ASIC, having a fixed data processing path, including:
      an input to receive the input data stream, wherein the input is coupled to the fixed data processing path;
      data alignment circuitry, coupled to the input of the ASIC, to temporally synchronize the second portion of the input data stream with the processing of the first portion of the input data stream via the logic circuitry of the FPGA; and
      data combining circuitry, coupled to the output of the FPGA and the data alignment circuitry, to generate output data using the processed data stream and the second portion of the input data stream from the data alignment circuitry.

2. The integrated circuit of claim 1 wherein the data alignment circuitry includes:
   masking control circuitry to delete the first portion of the input data stream from the input data stream received by the input of the logic circuitry.

3. The integrated circuit of claim 1 wherein the data alignment circuitry further includes:
   circuitry to temporally synchronize the second portion of the input data stream with a processing time of the first portion of the input data stream by the FPGA.

4. The integrated circuit of claim 1 wherein the data alignment circuitry further includes FIFO circuitry.

5. The integrated circuit of claim 1 wherein the data combining circuitry includes circuitry to generate the output data by interleaving or concatenating (i) data of the processed data stream and (ii) data of the second portion of the input data stream.

6. The integrated circuit of claim 1 wherein the data combining circuitry includes a logic OR circuitry to generate the output data using the processed data stream and the second portion of the input data stream from the data alignment circuitry.

7. The integrated circuit of claim 1 wherein the data combining circuitry includes a concatenation circuitry to generate the output data using the processed data stream and the second portion of the input data stream from the data alignment circuitry.

8. The integrated circuit of claim 1 wherein the first data processing operation includes digital signal processing, encoding, decoding, encrypting, and/or decrypting.

9. An integrated circuit comprising:
   an embedded FPGA including:
      an input to receive an input data stream wherein the input data stream includes a first portion and a second portion;
      processing circuitry to generate processed data by processing only the first portion of the input data stream via a data processing operation;
      an output to output the processed data;
   logic circuitry, separate from the embedded FPGA, including:
      an input to receive the input data stream;
      data alignment circuitry, coupled to the input of the logic circuitry, to temporally synchronize the second portion of the input data stream with the processing of the first portion of the input data stream via the processing circuitry of the embedded FPGA; and
      data combining circuitry, coupled to the output of the embedded FPGA and the data alignment circuitry, to generate an output data stream using the processed data and the second portion of the input data stream received from the data alignment circuitry.

10. The integrated circuit of claim 9 wherein the data alignment circuitry includes:
    masking control circuitry to delete the data of the first portion of the input data stream from the input data stream received by the input of the logic circuitry.

11. The integrated circuit of claim 9 wherein the data alignment circuitry further includes:
    circuitry to temporally synchronize the second portion of the input data stream with a processing time of the first portion of the input data stream by the processing circuitry of the embedded FPGA.

12. The integrated circuit of claim 9 wherein the data alignment circuitry further includes FIFO circuitry.

13. The integrated circuit of claim 9 wherein the data combining circuitry includes circuitry to generate the output data stream by interleaving data of the processed data and data of the second portion of the input data stream.

14. The integrated circuit of claim 9 wherein the data combining circuitry includes circuitry to generate the output data stream by concatenating data of the processed data and data of the second portion of the input data stream.

15. The integrated circuit of claim 9 wherein the data combining circuitry includes a logic OR circuitry to generate the output data stream using the processed data and the second portion of the input data stream from the data alignment circuitry.

16. The integrated circuit of claim 9 wherein the data combining circuitry includes a concatenation circuitry to generate output data stream using the processed data and the second portion of the input data stream from the data alignment circuitry.

17. The integrated circuit of claim 9 wherein the data processing operation includes digital signal processing, encoding, decoding, encrypting, and/or decrypting.

18. An integrated circuit comprising:
an embedded FPGA including:
an input to receive an input data stream wherein the input data stream includes a first portion and a second portion;
processing circuitry to generate processed data by processing only the first portion of the input data stream via a data processing operation;
an output to output the processed data;
logic circuitry, separate from the embedded FPGA, including:
an input to receive the input data stream;
data alignment circuitry, coupled to the input of the logic circuitry, of the logic circuitry, the data alignment circuitry includes:
circuitry to temporally synchronize the second portion of the input data stream with the processing of the first portion of the input data stream via the processing circuitry of the embedded FPGA, and
masking control circuitry to delete the data of the first portion of the input data stream from the input data stream received by the input of the logic circuitry; and
data combining circuitry, coupled to the output of the embedded FPGA and the data alignment circuitry, to generate an output data stream using the processed data and the second portion of the input data stream received from the data alignment circuitry.

19. The integrated circuit of claim 18 wherein the data processing operation includes digital signal processing, encoding, decoding, encrypting, and/or decrypting.

20. The integrated circuit of claim 18 wherein the data combining circuitry includes circuitry to generate the output data stream by interleaving or concatenating (i) data of the processed data and (ii) data of the second portion of the input data stream.

* * * * *